United States Patent
Jeong et al.

(10) Patent No.: US 7,504,333 B2
(45) Date of Patent: Mar. 17, 2009

(54) METHOD OF FORMING BIT LINE OF SEMICONDUCTOR DEVICE

(75) Inventors: Cheol Mo Jeong, Icheon-si (KR); Whee Won Cho, Cheongju-si (KR); Eun Soo Kim, Incheon (KR); Seung Hee Hong, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 256 days.

(21) Appl. No.: 11/614,082

(22) Filed: Dec. 21, 2006

(65) Prior Publication Data
US 2008/0003796 A1    Jan. 3, 2008

(30) Foreign Application Priority Data
Jun. 30, 2006    (KR) .................. 10-2006-0060373

(51) Int. Cl.
*H01L 21/20*    (2006.01)
(52) U.S. Cl. ................ 438/625; 438/640; 438/653; 438/685; 438/686; 438/687; 257/E21.171; 257/E21.579; 257/E21.597; 257/E23.145; 257/E23.179
(58) Field of Classification Search ............ 438/625, 438/633, 640, 653, 685, 686, 687; 257/E21.171, 257/579, 597, 705, 23.145, 23.179
See application file for complete search history.

(56) References Cited

U.S. PATENT DOCUMENTS

| | | | |
|---|---|---|---|
| 6,291,340 B1 | 9/2001 | Sandhu et al. | |
| 6,699,783 B2 * | 3/2004 | Raaijmakers et al. | 438/633 |
| 6,759,325 B2 * | 7/2004 | Raaijmakers et al. | 438/633 |
| 6,762,076 B2 * | 7/2004 | Kim et al. | 438/107 |
| 2004/0041264 A1 * | 3/2004 | Kloster et al. | 257/758 |
| 2005/0212139 A1 * | 9/2005 | Leinikka et al. | 257/762 |
| 2006/0273426 A1 * | 12/2006 | Iijima | 257/532 |
| 2007/0096321 A1 * | 5/2007 | Raaijmakers et al. | 257/758 |

FOREIGN PATENT DOCUMENTS

| | | |
|---|---|---|
| KR | 100255516 B1 | 2/2000 |
| KR | 100370781 B1 | 1/2003 |
| KR | 1020030059489 A | 7/2003 |

* cited by examiner

*Primary Examiner*—Michael S Lebentritt
(74) *Attorney, Agent, or Firm*—Townsend and Townsend and Crew LLP

(57) ABSTRACT

A method of forming a conductive structure (e.g., bit line) of a semiconductor device includes forming a barrier metal layer on a semiconductor substrate in which structures are formed. An amorphous titanium carbon nitride layer is formed on the barrier metal layer. A tungsten seed layer is formed on the amorphous titanium carbon nitride layer under an atmosphere including a boron gas. A tungsten layer is formed on the tungsten seed layer, thus forming a bit line.

22 Claims, 3 Drawing Sheets

METHOD OF FORMING BIT LINE OF SEMICONDUCTOR DEVICE

BACKGROUND OF THE INVENTION

The present invention relates in general to semiconductor devices and, more particularly, to a method of forming a conductive structure (e.g., bit line) of a semiconductor device, which can reduce the resistance of the bit line.

A method employing a damascene process has been widely used as a method of forming a bit line of NAND flash memory. However, as the level of integration increases, the thickness and Final Inspection Critical Dimension (FICD) of the bit line decrease. Accordingly, problems occur, such as an abrupt decrease in the resistivity of the bit line. The causes of the problems are as follows:

1. As the height of the bit line decreases due to an increase of the level of integration, the resistivity of the bit line increases.
2. As the FICD of the bit line decreases because of an increase of the level of integration, the resistivity of the bit line increases.
3. In the case of Reactive Ion Etch (RIE), variation in resistance is very severe according to the profile of the bit line.
4. Due to at least the above three reasons, in the case where the damascene process of forming a bit line by gap-filling a trench with a bit line material (i.e., tungsten) is used, the weight of the barrier metal layer, which is formed before a primary bit line material (i.e., a tungsten layer) is deposited, is increased. Accordingly, the area occupied by the tungsten layer is limited and, therefore, it is difficult to reduce bit line resistance.

SUMMARY OF THE INVENTION

The present invention relates to a method of forming a conductive structure (e.g., bit line) of a semiconductor device, which can reduce the resistance of the bit line.

According to one embodiment of the present invention, a method of forming a bit line of a semiconductor device includes forming a barrier metal layer on a semiconductor substrate in which structures are formed, forming an amorphous titanium carbon nitride layer on the barrier metal layer, forming a tungsten seed layer on the amorphous titanium carbon nitride layer under an atmosphere including a boron gas, and forming a tungsten layer on the tungsten seed layer, thus forming a bit line.

According to another embodiment of the present invention, a method of forming a bit line of a semiconductor device includes forming an interlayer insulating layer on a semiconductor substrate in which structures are formed, and etching the interlayer insulating layer to form a trench, forming a barrier metal layer on the entire surface including the trench, forming an amorphous titanium carbon nitride layer on the barrier metal layer, forming a tungsten seed layer on the amorphous titanium carbon nitride layer under an atmosphere including a boron gas, and forming a tungsten layer on the tungsten seed layer, thus forming a bit line.

DESCRIPTION OF SPECIFIC EMBODIMENTS

FIGS. 1A to 1D are cross-sectional views illustrating a method of forming a conductive structure (e.g., bit line) of a semiconductor device according to an embodiment of the present invention.

Figure 1A:
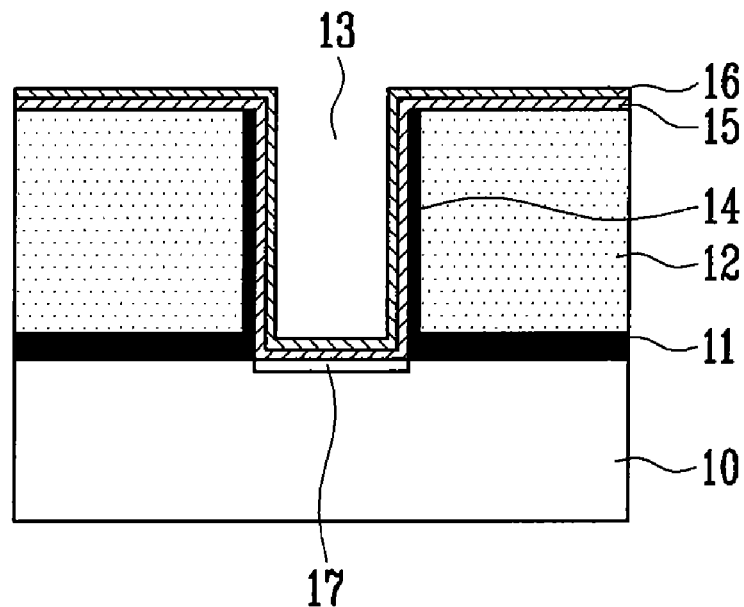
FIGS. 1A to 1D are cross-sectional views illustrating a method of forming a bit line of a semiconductor device according to an embodiment of the present invention.

Referring to FIG. 1A, an etch-stop layer 11 and an interlayer insulating layer 12 are formed on a semiconductor substrate 10 in which a variety of elements for forming the semiconductor device, such as transistors, flash memory cells, metal lines and plugs, are formed. It is preferred that the etch-stop layer 11 be formed using a nitride layer and the interlayer insulating layer 12 be formed using an oxide layer.

The interlayer insulating layer 12 and the etch-stop layer 11 are etched by a photo and etch processes, thus forming a trench 13. A nitride layer is deposited on the surface including the trench 13 to secure the capacitance between bit lines by preventing the width of the interlayer insulating layer 12 from decreasing during a subsequent cleaning process (see next paragraph). The cleaning process employs an oxide layer etch solution in the present implementation. The nitride layer is etched to form a spacer 14 on the sidewalls of the trench 13.

Thereafter, a native oxide layer formed in the trench 13 is removed by a cleaning process employing an oxide layer etch solution, such as Buffer Oxide Etchant (BOE). A Ti layer 15 and a TiN layer 16 are formed as barrier metals. It is preferable that the Ti layer 15 be formed by an Ion Metal Plasma (IMP) deposition method, and the TiN layer 16 be formed by a Metal Organic Chemical Vapor Deposition (MOCVD) method.

A thermal treatment process is performed to form an ohmic contact layer 17 at the interface of the Ti layer 15 and the semiconductor substrate 10. The ohmic contact layer 17 is formed through the reaction of the Ti component of the Ti layer 15 and the Si component of the semiconductor substrate 10 by the thermal treatment process. The ohmic contact layer 17 functions to lower the contact resistance. In some embodiments, a Rapid Thermal Annealing (RTA) process may be used as the thermal treatment process.

Figure 1B:
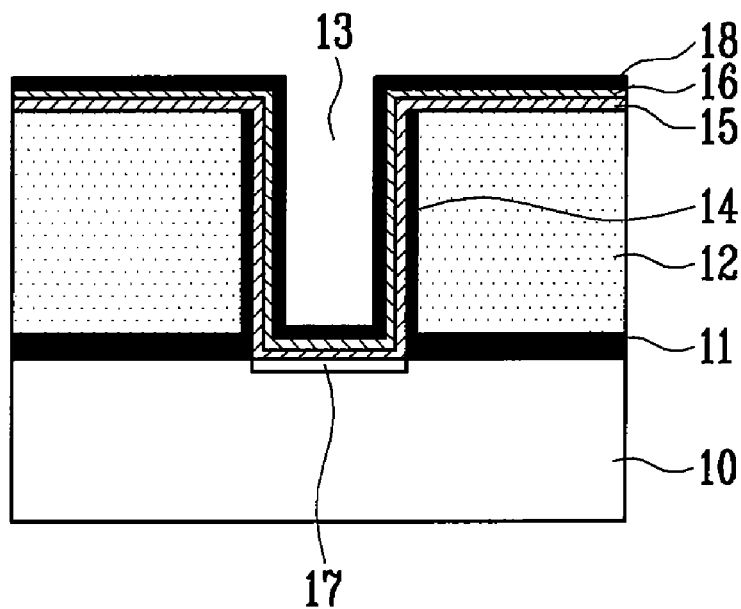

Referring to FIG. 1B, an amorphous titanium carbon nitride layer 18 is deposited as a glue layer. The amorphous titanium carbon nitride layer 18 serves to control the seed number of tungsten (i.e., a primary bit line material), which is formed later on and is formed in form of crystalline $TiC_{1-x}N_x$ ($0.1 \leq x \leq 0.99$). In some embodiments, the amorphous titanium carbon nitride layer 18 is formed to a thickness of about 10 Å to about 100 Å.

The titanium carbon nitride layer 18 can be easily deposited in a TiN deposition chamber using one of TDMAT (tetrakis dimethylamino titanium, $Ti[N(CH_3)_2]_4$) and TDEAT (tetrakis diethylamino titanium, $Ti[N(C_2H_5)_2]_4$) as a precursor without using plasma treatment.

Figure 1C:
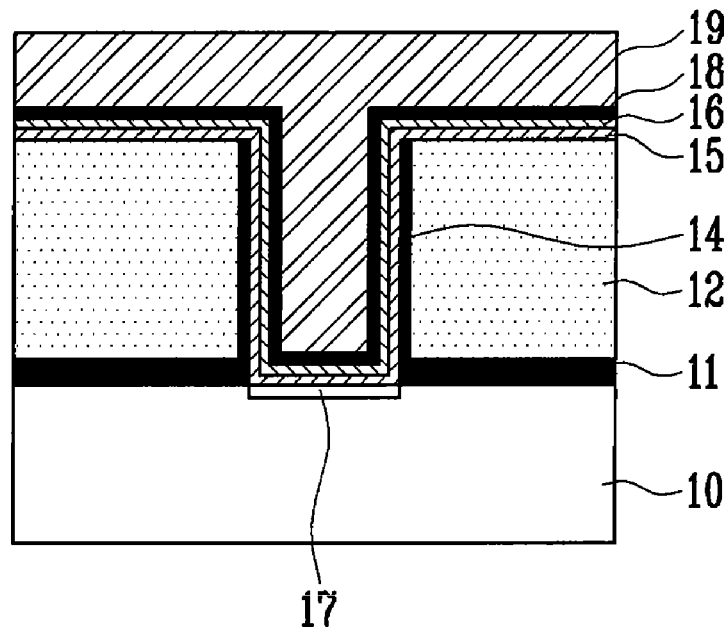

Referring to FIG. 1C, a primary bit line material (for example, a tungsten layer 19) is formed on the amorphous titanium carbon nitride layer 18.

In order to form the tungsten layer 19, a tungsten seed layer is first formed on the amorphous titanium carbon nitride layer 18. At this time, the number of tungsten seeds is controlled by the amorphous titanium carbon nitride layer 18.

The tungsten seed layer may be formed by either an Atomic Layer Deposition (ALD) method or a Pulsed Nucleation Layer (PNL) method of depositing the tungsten seed layer while repeating the step of supplying and purging a gas. A boron gas is added to an atmosphere gas including $WF_6$ and $SiH_4$ so that tungsten having a big grain size can be formed. In some embodiments, the tungsten seed layer is formed to a thickness of about 10 Å to about 300 Å and the tungsten seed layer is formed at a temperature of about 350° C. to about 550° C. In some embodiments, a $B_2H_6$ gas is used as the source of the boron gas. Bulk tungsten is then deposited by flowing $H_2$ and $WF_6$, thus forming the tungsten layer 19. The bulk tungsten deposition process and the tungsten seed layer formation process may be formed in-situ.

The method of forming the tungsten layer 19 may employ a Chemical Vapor Deposition (CVD) or Physical Vapor Deposition (PVD) method. However, in order to secure gap-fill margin according to the gap-fill of the trench 13, a CVD method having a good step coverage characteristic is preferably used.

As described above, the seed number of the tungsten seed layer is controlled by the amorphous titanium carbon nitride layer 18, and the tungsten seed layer is formed under the atmosphere including the boron gas. Accordingly, an initial bulk tungsten layer is deposited in an amorphous state and tungsten of a crystalline state is deposited on the initial bulk tungsten layer. Accordingly, the resistivity of the tungsten layer 19 can be decreased since the crystalline tungsten layer formed on the amorphous tungsten layer has a big grain size.

Figure 1D:
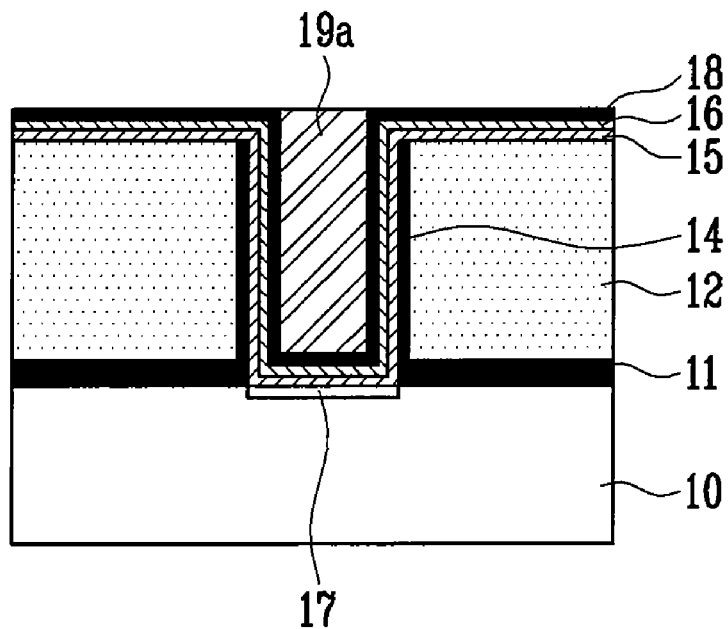

Referring to FIG. 1D, the tungsten layer 19 is polished such that the TiN layer 16 is exposed, thus forming a bit line 19a.

In the above embodiment, an example in which the bit line is formed within the trench of a single damascene structure has been described. It should be appreciated that the present invention can be applied to a dual damascene structure. Furthermore, the present invention may be applied to a RIE structure in which a bit line is first formed and an insulating layer is then formed in order to separate bit lines from each other, unlike the damascene process of forming a bit line within a previously formed trench.

Figure 2:
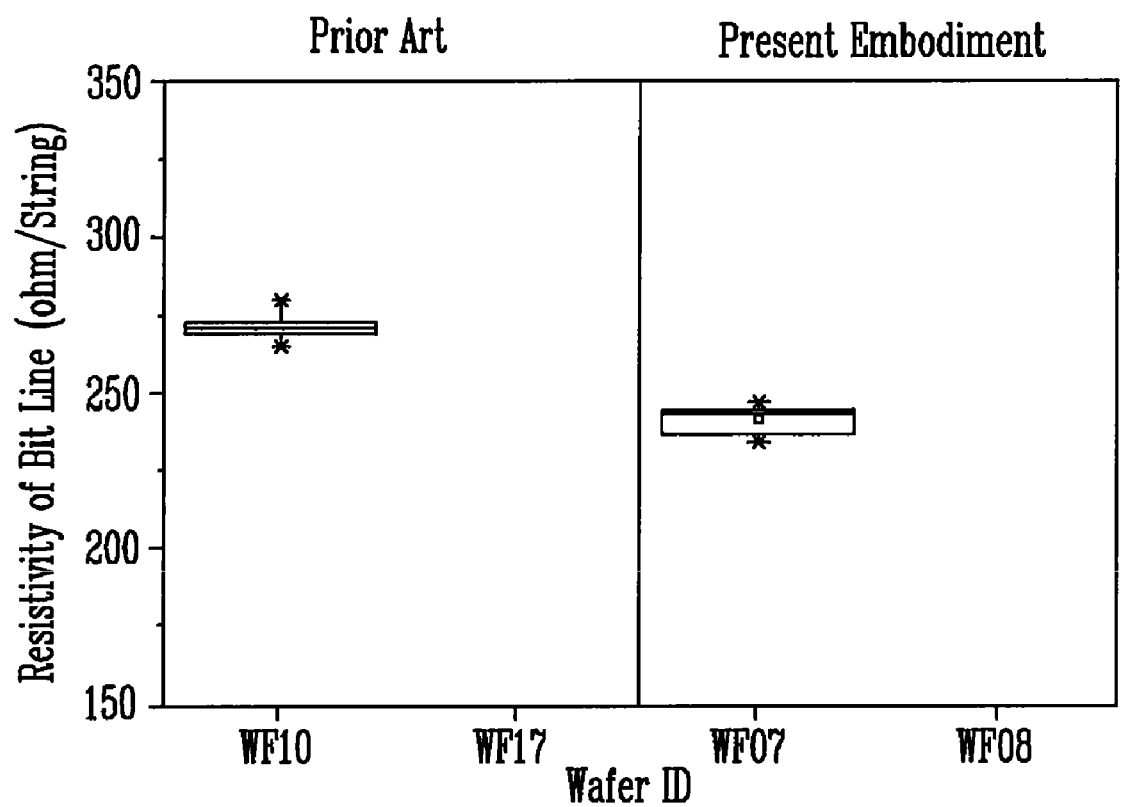
FIG. 2 is a view illustrating a comparison result between the resistivity Rs of a conventional bit line and the resistivity Rs of a bit line according to an embodiment of the present invention.

FIG. 2 is a view illustrating a comparison result between the resistivity Rs of a conventional bit line and the resistivity Rs of a bit line according to an embodiment of the present invention.

From FIG. 2, it can be seen that the resistivity of the conventional bit line is about 270 ohm/string, whereas the resistivity of the bit line according to the present embodiment is about 220 ohm/string, which is significantly lower than that of the prior art.

As described above, according to the present invention, before a tungsten layer (i.e., a conductive layer for a primary bit line material) is formed, an amorphous titanium carbon nitride layer is formed in order to control the seed number of a tungsten seed layer. The tungsten seed layer is formed under an atmosphere including a boron gas in order to form an initial tungsten layer of an amorphous state. The tungsten layer formed on the amorphous tungsten layer has a big grain size. It is therefore possible to secure an electrical characteristic of devices since the resistivity of a bit line can be lowered.

Although the foregoing description has been made with reference to the various embodiments, it is to be understood that changes and modifications of the present invention may be made by the ordinary skilled in the art without departing from the spirit and scope of the detailed description and appended claims.

What is claimed is:

1. A method for forming of a semiconductor device, the method comprising:
    forming a barrier metal layer over a trench provided on a semiconductor substrate, the barrier metal layer being provided over surfaces of the trench;
    forming an amorphous titanium carbon nitride layer over the barrier metal layer;
    forming a tungsten seed layer over the amorphous titanium carbon nitride layer; and
    forming a tungsten layer over the tungsten seed layer to form a conductive structure.

2. The method of claim 1, wherein the tungsten seed layer is formed directly on the amorphous titanium carbon nitride layer, so that the amorphous titanium carbon nitride layer is used to control a seed number of the tungsten seed layer, wherein the conductive structure is a bit line.

3. The method of claim 2, wherein the tungsten seed layer is formed in an atmosphere including a boron gas to provide the tungsten seed layer with a big grain size.

4. The method of claim 3, wherein the tungsten layer is formed directly on the tungsten seed layer, the tungsten layer having a crystalline state.

5. The method of claim 3, wherein $B_2H_6$ is used as a source of the boron gas.

6. The method of claim 1, wherein the bit line has a resistivity of about 220 ohm/string.

7. The method of claim 1, wherein the amorphous titanium nitride layer is formed to a thickness of about 10 Å to about 100 Å, wherein the conductive structure is a single damascene structure or a dual damascene structure.

8. The method of claim 1, wherein the amorphous titanium nitride layer is formed using one of TDMAT (tetrakis dimethylamino titanium, $Ti[N(CH_3)_2]_4$) and TDEAT (tetrakis diethylamino titanium, $Ti[N(C_2H_5)_2]_4$) as a precursor.

9. The method of claim 1, wherein the tungsten seed layer is formed under an atmosphere including $SiH_4$, $WF_6$, and a boron gas.

10. The method of claim 1, wherein the tungsten seed layer is formed to a thickness of about 10 Å to about 300 Å at a temperature of about 350° C. to about 550° C.

11. The method of claim 1, wherein the tungsten seed layer is formed by an Atomic Layer Deposition (ALD) or Pulsed Nucleation Layer (PNL) method.

12. The method of claim 1, further comprising, after the barrier metal layer is formed, performing a thermal treatment process to form an ohmic contact layer at the interface of the semiconductor substrate and the barrier metal layer.

13. The method of claim 12, wherein the thermal treatment process employs a Rapid Thermal Treatment (RTA) process.

14. The method of claim 1, wherein the barrier metal layer is formed using includes a Ti layer and a TiN layer.

15. A method of forming a bit line of a semiconductor device, the method comprising:
    forming an interlayer insulating layer on a semiconductor substrate in which structures are formed, and etching the interlayer insulating layer to form a trench;
    forming a barrier metal layer over the trench;
    forming an amorphous titanium carbon nitride layer on the barrier metal layer;
    forming a tungsten seed layer on the amorphous titanium carbon nitride layer under an atmosphere including a boron gas; and
    forming a tungsten layer on the tungsten seed layer to from a bit line.

16. The method of claim 15, wherein the amorphous titanium nitride layer is formed to a thickness of about 10 Å to about 100 Å.

17. The method of claim 15, wherein the amorphous titanium nitride layer is formed using one of TDMAT (tetrakis dimethylamino titanium, $Ti[N(CH_3)_2]_4$) and TDEAT (tetrakis diethylamino titanium, $Ti[N(C_2H_5)_2]_4$) as a precursor, wherein $B_2H_6$ is used as a source of the boron gas.

18. The method of claim 15, wherein the atmosphere includes $SiH_4$ and $WF_6$, wherein the tungsten seed layer is formed to a thickness of about 10 Å to about 300 Å at a temperature of about 350° C. to about 550° C., wherein the tungsten seed layer is formed by an Atomic Layer Deposition (ALD) or Pulsed Nucleation Layer (PNL) method.

19. A method for forming of a semiconductor device, the method comprising:
   forming a barrier metal layer over a trench provided on a semiconductor substrate, the barrier metal layer being provided over surfaces of the trench;
   forming an amorphous layer over the barrier metal layer, the amorphous layer including metal;
   forming a conductive seed layer over the amorphous layer, the conductive seed layer having a given metal; and
   forming a conductive layer over the tungsten seed layer to form a conductive structure, the conductive layer having the same given metal.

20. The method of claim 19, wherein the conductive seed layer is formed directly on the amorphous layer, so that the amorphous layer is used to control a seed number of the conductive seed layer,
   wherein the tungsten seed layer is formed in an atmosphere including a boron gas to provide the conductive seed layer with a big grain size, and
   wherein the conductive structure is a single damascene structure or a dual damascene structure.

21. The method of claim 20, wherein the conductive layer is formed directly on the tungsten seed layer, the tungsten layer having a crystalline state,
   wherein $B_2H_6$ is used as a source of the boron gas, and
   wherein the conductive structure is a bit line.

22. The method of claim 19, wherein the amorphous layer is the amorphous titanium carbon nitride layer, wherein the conductive seed layer and the conductive layer each includes tungsten.

* * * * *